United States Patent
Hoschek

(10) Patent No.: US 6,748,747 B2
(45) Date of Patent: Jun. 15, 2004

(54) METHOD AND SYSTEM FOR TEMPERATURE REGULATION OF A PELTIER ELEMENT

(75) Inventor: Wilhelm Hoschek, Fischamend (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/225,954

(22) Filed: Aug. 22, 2002

(65) Prior Publication Data
US 2003/0051485 A1 Mar. 20, 2003

(30) Foreign Application Priority Data
Aug. 22, 2001 (DE) .......................................... 101 41 083

(51) Int. Cl.[7] .............................................. F25B 21/02
(52) U.S. Cl. ..................................................... 62/3.7
(58) Field of Search ............................. 62/3.2, 3.3, 3.7

(56) References Cited

U.S. PATENT DOCUMENTS

| 5,515,682 | A | * | 5/1996 | Nagakubo et al. | ............ | 62/3.7 |
| 6,125,636 | A |   | 10/2000 | Taylor et al. | | |
| 6,205,790 | B1 | * | 3/2001 | Denkin et al. | ................ | 62/3.7 |
| 6,311,497 | B1 | * | 11/2001 | Chung | .......................... | 62/3.3 |
| 6,519,949 | B1 | * | 2/2003 | Wernlund et al. | ............. | 62/3.7 |
| 6,584,128 | B2 | * | 6/2003 | Kroeger | ........................ | 372/34 |
| 2002/0092307 | A1 | * | 7/2002 | Ghoshal | ........................ | 62/3.7 |
| 2002/0121094 | A1 | * | 9/2002 | VanHoudt | ...................... | 62/3.3 |
| 2003/0005707 | A1 | * | 1/2003 | Ookura et al. | ................ | 62/3.7 |
| 2003/0033819 | A1 | * | 2/2003 | Prescott | ........................ | 62/3.7 |

FOREIGN PATENT DOCUMENTS

DE      37 42 269      1/1989

* cited by examiner

*Primary Examiner*—William C. Doerrler
(74) *Attorney, Agent, or Firm*—Bell Boyd & Lloyd

(57) ABSTRACT

The temperature of a Peltier element is regulated by two control loops. In the ranges where only heating or only cooling are intended to be carried out, the regulation is provided via a voltage converter. In the critical operating range which covers the transition between heating and cooling, a low operating voltage is converted to a drive AC voltage with the aid of a polarity reversal switch and both heating and cooling are carried out, depending on the polarity. The temperature is then regulated by varying the duty ratio.

7 Claims, 1 Drawing Sheet

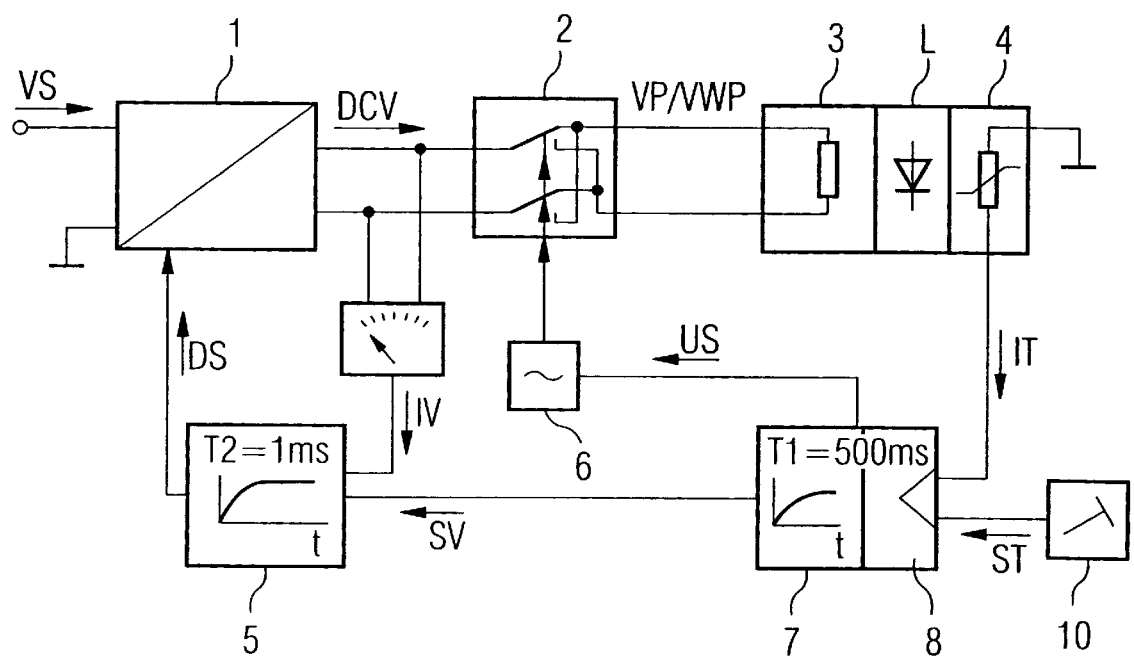

METHOD AND SYSTEM FOR TEMPERATURE REGULATION OF A PELTIER ELEMENT

BACKGROUND OF THE INVENTION

A Peltier element can provide both heating and cooling depending on the polarity of the applied voltage, or the direction of its operating current. In this case, it is known for the voltage which is applied to the Peltier element, or the operating current, to be regulated. In the case of low-loss voltage regulation via an AC/DCV converter or a DCV/DCV converter, the output voltage cannot be regulated down to the value 0 since the pulse width of the converter cannot be made indefinitely narrow. As such, accurate regulation in the transitional range between heating and cooling is impossible. Furthermore, temperature fluctuations can occur in the transitional range between heating and cooling, since the polarity of the operating voltage for the Peltier element is reversed with a relatively long time constant in the control loop.

The known regulation systems are unsuitable for many applications, such as the temperature stabilization of lasers which are used for transmission purposes.

SUMMARY OF THE INVENTION

The particular advantage of the temperature regulation pursuant to the present invention is its accuracy in the transitional range between heating and cooling. In this range, the voltage converter supplies only a low output voltage, so that only a small power loss is required even in the event of periodic switching between heating and cooling.

The use of different time constants for the temperature and for the voltage regulation makes it possible to suppress disturbance influences resulting from the supply voltage.

Additional features and advantages of the present invention are described in, and will be apparent from, the following Detailed Description of the Invention and the Figures.

DETAILED DESCRIPTION OF THE INVENTION

The arrangement which is illustrated in FIG. 1 contains the concatenated circuit of a voltage converter 1, a polarity reversal switch 2 and a Peltier element 3. The Peltier element 3 is, for example, permanently connected to a transmission laser L, whose temperature must be regulated accurately, and is likewise connected to a temperature measurement device 4, such as to an NTC thermistor (NTC=negative temperature coefficient), in order to make it possible to measure the temperature as accurately as possible. The voltage converter 1 converts the supply voltage VS, which may be an AC voltage or a DC voltage, to a DC voltage, the operating voltage DCV, which is supplied via the polarity reversal switch 2 to the Peltier element as a drive DC voltage VP or drive AC voltage VWP. Furthermore, a temperature regulator 7 is provided, which contains a comparison circuit 8 to which a measured temperature actual value IT is supplied, and to which a temperature nominal value ST is supplied from an adjustment device 10. The temperature regulator produces a voltage nominal value SV, which is supplied to a voltage regulator 5, to which a voltage actual value IV is also supplied, via a voltage measurement device 9, from the output of the voltage converter 1. A clock generator 6 controls the polarity reversal switch 2 on the basis of a polarity reversal control signal US which is emitted from the temperature regulator.

The temperature of the Peltier element 3 is measured by the temperature measurement device 4 in a first control loop 4, 8, 7, 5, 1, 2, 3, and the output voltage DCV of the voltage converter 1, and hence the temperature of the Peltier element 3, are regulated appropriately by a voltage control signal DS, via the temperature regulator 7 and the voltage regulator 5. The voltage regulator 5 receives its voltage nominal value SV from the temperature regulator 7 in this case, and is not required for the actual temperature regulation.

A voltage measurement device 9, the voltage regulator 5 and the voltage converter 1 form an inner control loop 9, 5, 1. The output voltage DCV from the voltage converter 1, that is to say the operating voltage DCV for the Peltier element 3, is measured, and the voltage actual value IV is supplied to the voltage regulator 5. The voltage nominal value SV is produced by the temperature regulator 7. The time constant T2 (1 ms) of the voltage regulator 5 is considerably shorter than the time constant T1 (500 ms) of the temperature regulator 7, wherein voltage fluctuations ΔDCV in the operating voltage DCV are regulated out quickly, thus ensuring an operating voltage DCV, or drive voltage VP, VWP which is free of external disturbance influences, for the Peltier element 3.

A second control loop 4, 8, 7, 6, 2, 3 contains the clock generator 6 which, likewise controlled by the temperature regulator 7, produces the polarity reversal control signal US. This governs the polarity of the drive DC voltage VP, or the duty ratio of a drive AC voltage which is produced by periodic polarity reversal.

In a first operating range, the heating range, the changeover switch 2 is permanently set by the temperature regulator 7 (via the clock generator which emits a continuous output) to the polarity of the drive DC voltage VP of the Peltier element 3 for heating. The temperature of the Peltier element 3, and hence of the laser L, is regulated via the voltage regulator 5, which is controlled by the temperature regulator 7 and, in turn, controls the voltage converter 1. Since the time constant for temperature regulation is essentially governed by the temperature regulator 7, the operating voltage DCV is regulated relatively slowly as a function of the temperature; for example, with a time constant of 500 ms, although this is sufficient to compensate for all environmental influences.

In a second operating range, the transitional range between heating and cooling, the clock generator 6 is activated by the temperature regulator 7 by changing the polarity reversal signal US. If the operating voltage DCV is low, it now supplies a drive AC voltage VWP, whose frequency is chosen to be sufficiently high that it does not influence the regulation accuracy, owing to the inertia of the Peltier element. This frequency is 60 Hz (above 40 Hz), as a function of the characteristics of the Peltier element and of the components that are connected to it in the exemplary embodiment. Different polarities are thus applied alternately to the connections of the Peltier element, so that cooling and heating are carried out during one cycle of the drive AC voltage VWP. The temperature regulator 7 varies the duty ratio of the drive AC voltage VWP on the basis of the measured temperature IT, and thus allows a continuous regulation characteristic between the heating range and the cooling range. Thus, it is possible to regulate out a temperature difference of 0.0° C. without oscillations, since the switching frequency is well above the cut-off frequency of the temperature regulator.

In a third operating range, the cooling range, the changeover switch 2 is set such that the Peltier element provides continuous cooling on the basis of the applied voltage. The temperature regulation is once again carried out only via the temperature regulator 7 and the voltage regulator 5.

Although the present invention has been described with reference to specific embodiments, those of skill in the art will recognize that changes may be made thereto without departing from the spirit and scope of the present invention as set forth in the hereafter appended claims.

What is claimed is:

1. A method for temperature regulation of a Peltier element, the method comprising the steps of:

regulating the temperature of the Peltier element in a first operating range only by heating, wherein a drive DC voltage is applied to the Peltier element, with a level of the drive DC voltage being regulated in a first control loop down to a minimum value;

regulating the temperature of the Peltier element in a second operating range by alternating heating and cooling, wherein a low drive AC voltage is applied to the Peltier element, with a duty ratio of the low drive AC voltage, and thus a ratio of associated cooling to heating sections, being varied in a second control loop; and regulating the temperature of the Peltier element in a third operating range only by cooling, wherein a reverse drive DC voltage is applied to the Peltier element, with a level of the reverse drive DC voltage being regulated in the first control loop down to a minimum value.

2. A method for temperature regulation of a Peltier element as claimed in claim 1, wherein the drive AC voltage is produced by periodically reversing a polarity of a variable operating voltage.

3. A method for temperature regulation of a Peltier element as claimed in claim 1, wherein a frequency of the drive AC voltage is substantially above a cut-off frequency of the second control loop.

4. A method for temperature regulation of a Peltier element as claimed in claim 2, wherein the drive DC voltage is regulated in the first control loop as a function of the measured temperature with a longer time constant, and is regulated as a function of its voltage fluctuations with a substantially shorter time constant.

5. A system for temperature regulation of a Peltier element, comprising:

a voltage converter which supplies the Peltier element with a drive voltage via a polarity reversal device;

a first control loop which contains a voltage regulator for regulating an operating voltage, which is output from the voltage converter, based on a measured temperature, and for reversing polarity of the operating voltage for cooling; and a second control loop which contains a temperature regulator and a clock generator for controlling the polarity reversal device, with the Peltier element being heated in a first operating range with a drive DC voltage derived from the operating voltage, with a drive AC voltage being produced in a second operating range by periodically reversing the polarity of the operating voltage, wherein a duty ratio of the drive AC voltage, and thus a ratio of associated cooling to heating sections is regulated based on the measured temperature, and with the Peltier element being cooled in a third operating range.

6. A system for temperature regulation of a Peltier element as claimed in claim 5, wherein an output of the voltage converter is connected to a voltage measurement device, whose output is connected to an input of the voltage regulator, to whose other input the temperature regulator supplies a voltage nominal value which is derived from the measured temperature.

7. A system for temperature regulation of a Peltier element as claimed in claim 5, wherein the temperature regulator is designed to permanently set or periodically reverse the polarity of the polarity reversal device as a function of the measured temperature, with the duty ratio being controlled.

* * * * *